' = 
United States Patent [19]

Morita et al.

[11] 4,121,254
[45] Oct. 17, 1978

[54] AUTOMATIC FINE TUNING CIRCUIT

[75] Inventors: Kouji Morita, Kodaira; Katsuo Isono, Kawagoe, both of Japan

[73] Assignee: Sony Corporation, Tokyo, Japan

[21] Appl. No.: 754,167

[22] Filed: Dec. 27, 1976

[30] Foreign Application Priority Data

Dec. 26, 1975 [JP] Japan ................................ 51-157207
Dec. 26, 1975 [JP] Japan ................................ 51-157208

[51] Int. Cl.$^2$ .......................... H04N 5/50; H04B 1/26
[52] U.S. Cl. ................................... 358/195; 325/335; 325/423
[58] Field of Search ................. 358/191, 195; 334/16; 325/335, 418, 420, 422, 423

[56] References Cited

U.S. PATENT DOCUMENTS

| 3,867,568 | 2/1975 | Merriweather | 358/195 |
| 3,869,674 | 3/1975 | Borbely | 325/423 |
| 3,940,554 | 2/1976 | Masuda | 325/420 |
| 3,946,329 | 3/1976 | Caspari | 325/423 |
| 3,949,158 | 4/1976 | Rzeszewski | 325/423 |
| 3,952,143 | 4/1976 | Siwko | 325/420 |

Primary Examiner—Robert L. Griffin
Assistant Examiner—Marc E. Bookbinder
Attorney, Agent, or Firm—Lewis H. Eslinger; Alvin Sinderbrand

[57] ABSTRACT

A relatively broad band automatic fine tuning circuit covering a frequency band at least approximately as broad as a television channel and including means to shift the frequency of the television tuner up or down, as necessary, to the proper frequency within the automatic tuning range. A first control signal is obtained by comparing the average value of the envelope detected signal from the video detector with a voltage equal to the pedestal level if the signal were a properly tuned video signal. If the actual average value of the envelope is between zero volts and the pedestal voltage, the tuner is either correctly tuned or tuned at a somewhat lower frequency than is correct. If the voltage average value has a greater magnitude than the pedestal voltage the tuning of the tuner is too high. A frequency discriminator receiving the video IF signal controls the automatic tuning operation close to the desired frequency. A noise detector in the audio circuit controls a muting circuit to disable AFT operation if the receiver is so far out of tune as to receive noise instead of an audio signal.

5 Claims, 9 Drawing Figures

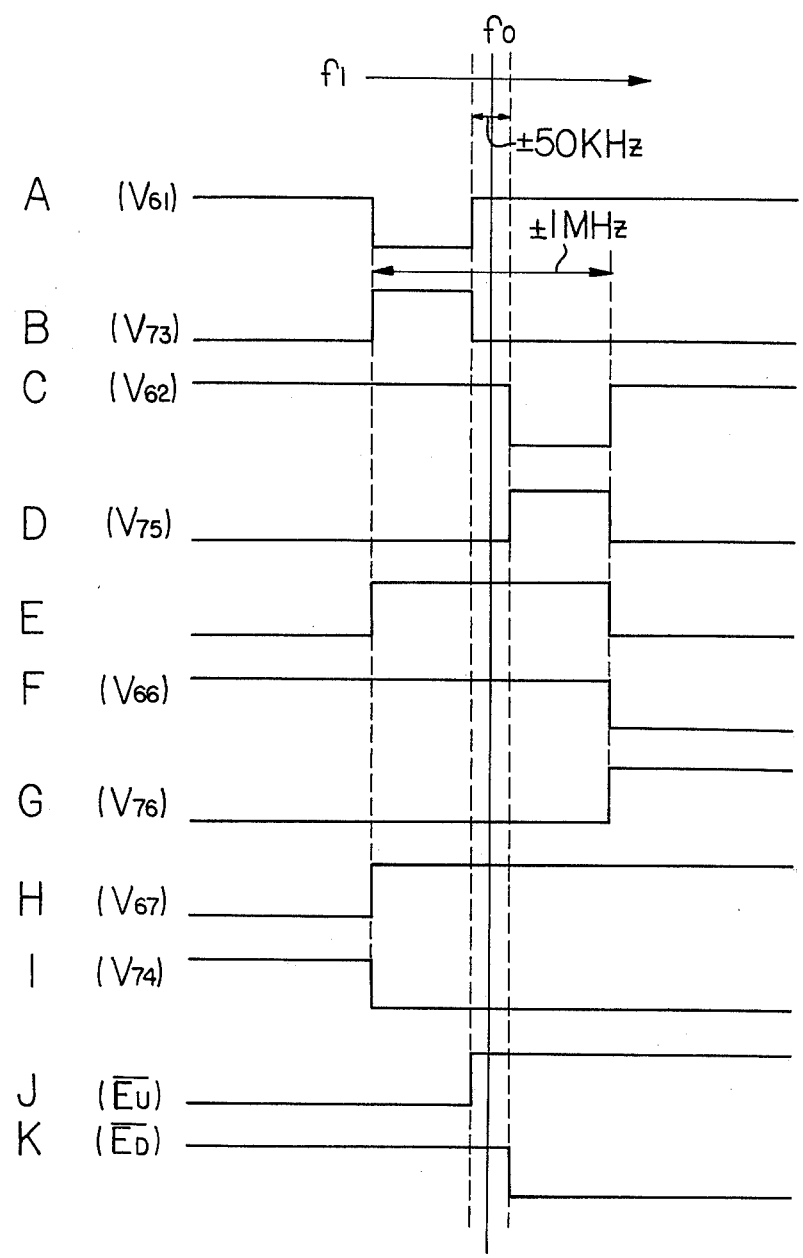

AUTOMATIC FINE TUNING CIRCUIT

BACKGROUND OF THE INVENTION

1. Field of the Invention

This invention relates to automatic fine tuning (AFT) circuits for controlling the frequency of television receiver tuners. More particularly, the invention is directed to a controllable AFT circuit that operates over a relatively wide frequency range covering a greater frequency band than the band of a single television channel.

2. Description of the Prior Art

AFT circuits for controlling the frequency to which television tuners are tuned have been described heretofore in companion cases U.S. Patent Application Ser. No. 716,655, filed Aug. 23, 1976, now U.S. Pat. No. 4,085,371 and U.S. Patent Application Ser. No. 752,427, filed Dec. 20, 1976, and both assigned to the assignee of the present application. Such AFT circuits translate the difference between the frequency $f_o$ of a desired television channel and the actual tuned frequency into a digital signal which is then used, in conjunction with a stored digital code, to derive an analog signal to be applied to a tuning element, such as a variable capacitance diode, that responds to voltage amplitude to control its reactance. Such a diode can be used in a circuit tunable over the television frequency bands, both the uhf and the vhf bands.

The automatic fine tuning circuit is desirable because various factors affect the tuning of the circuit. For example, temperature variations, aging of the components and other environmental factors can cause the tuning to shift from the desired frequency. Thus, even when a digital code corresponding to the analog voltage required to be applied to the voltage responsive reactance is recorded in a memory device it is not certain that the receiver will always return to exactly the proper frequency when that code is activated. Automatic adjustment of the code and therefore of the tuned frequency, is necessary to achieve the desirable result of unattended operation of the tuner.

One of the limitations of the AFT circuits in the companion applications is that they are arranged to operate in a relatively narrow band width of about ±1.2mHz on either side of the desired carrier frequency $f_o$. If the frequency of the local osillator shifts outside of this band of $f_o$ ±1.2mHz, the AFT circuits in the companion applications will not work. One possibility for shifting the frequency too far is that the sound carrier of an adjacent channel, which may be only 1.5mHz away from the desired video carrier, may pull the AFT circuit into tuned relationship with that undesired sound carrier. Another possibility for permitting the tuning to drift outside of the AFT range arises if the receiver is allowed to continue to operate after the transmitter has gone off the air. Under such circumstance the AFT circuit may attempt to tune to a signal that is not present, and if that happens, the frequency to which the tuner is adjusted may be so far out of the desired range that when the channel does come back onto the air the AFT circuit will be unable to bring the tuner back to the proper frequency.

OBJECTS AND SUMMARY OF THE INVENTION

One of the objects of this invention is to obtain an AFT circuit with a wide frequency range of AFT control.

Another object of the invention is to disable the AFT operation when there is no incoming signal, thereby preventing improper AFT operation in the absence of a signal. Still another object of this invention is to obtain a wide controllable frequency AFT range that can be used to control an electronically tuned tuner in a channel selector that does not require the use of preset potentiometers for channel selection.

In accordance with the invention, use is made of the fact that in a receiver having an electronically tuned tuner, an AGC circuit keeps the peak-to-peak voltage at certain circuit points, for example, in the video IF circuit, at a relatively fixed level. Use is further made of the fact that when the television tuner is tuned to the proper frequency to receive a desired channel, the signal in the video IF circuit is an amplitude-modulated signal with a carrier at the IF frequency. The synchronizing pulses of this amplitude-modulated signal have certain peak-to-peak values. When such a video signal is demodulated in the usual video envelope detector, the sync signal peaks have a predetermined voltage relative to zero. Industry and governmental standards require that the blanking level of such demodulated video signals be a voltage level between the voltage of the sync signals and zero and be a certain fraction of the sync peak voltage, for example 75% of the sync peak voltage. Furthermore, because of the pulsating nature of the demodulated video signal, the average value of the signal is between the blanking level and zero.

The invention further makes use of the fact that when the receiver is not properly tuned to a channel but is offset, for example to the audio signal frequency, the repetitive pulsating waveform that occurs at proper tuning of the tuner is no longer present, or is not nearly so prominent. Instead, the waveform is more nearly at a constant value so that envelope detection of such a waveform would simply be a DC signal at the voltage value equal to the sync signal peaks. This is because the AGC circuit maintains the peak-to-peak value relatively constant no matter whether the signal being received is a video signal or is a signal that has a relatively constant peak-to-peak amplitude.

The invention particularly makes use of the fact that, if the average value of the envelope detected signal from the video IF section has a value between zero and the blanking level that would exist if the received signal were a properly tuned-in video signal, the tuner is tuned either to the correct frequency or to too low a frequency. On the other hand, if the average value of the signal at that point in the video IF section of the circuit has a greater magnitude that such video blanking level, the tuner is tuned to a frequency above the correct frequency. Means are provided to determine the average value of the envelope detected signal and to compare it with a voltage that represents the blanking level. This is referred to in the following specification as the first detecting signal.

The invention further includes more accurate means to respond to the video signal before it reaches the video detector. The signal, preferably in the IF section of the receiver, is passed through a discriminating circuit that determines, by response of the signal passing through it, the exact setting of the tuner corresponding to reception of a high amplitude carrier signal. This is the second detected signal.

When the frequency to which the tuner is tuned is shifted too far from an available television channel, for example about 4 mHz lower or 3 mHz higher than an existing, received channel, noise components in the usual intercarrier sound system audio amplifier become excessive. These noise signals are detected, in accordance with this invention, to furnish a third detecting signal to set the outermost limits within which the AFT operation can take place.

There are two high level carrier signals in each television channel, one for the video and one for the audio. Therefore, the invention further includes means to detect what is essentially a DC signal when the tuner is tuned relatively close to the frequency that permits the video carrier and its near sidebands to pass through the last-named circuit. The invention includes means to utilize the latter signal to control the AFT operation so that the tuner will not lock on a sound carrier signal.

BRIEF DESCRIPTION OF THE DRAWINGS

FIGS. 9A–9K are graphs of frequency response of different sections of the circuit in FIG. 8.

DETAILED DESCRIPTION OF THE INVENTION

Figure 1:
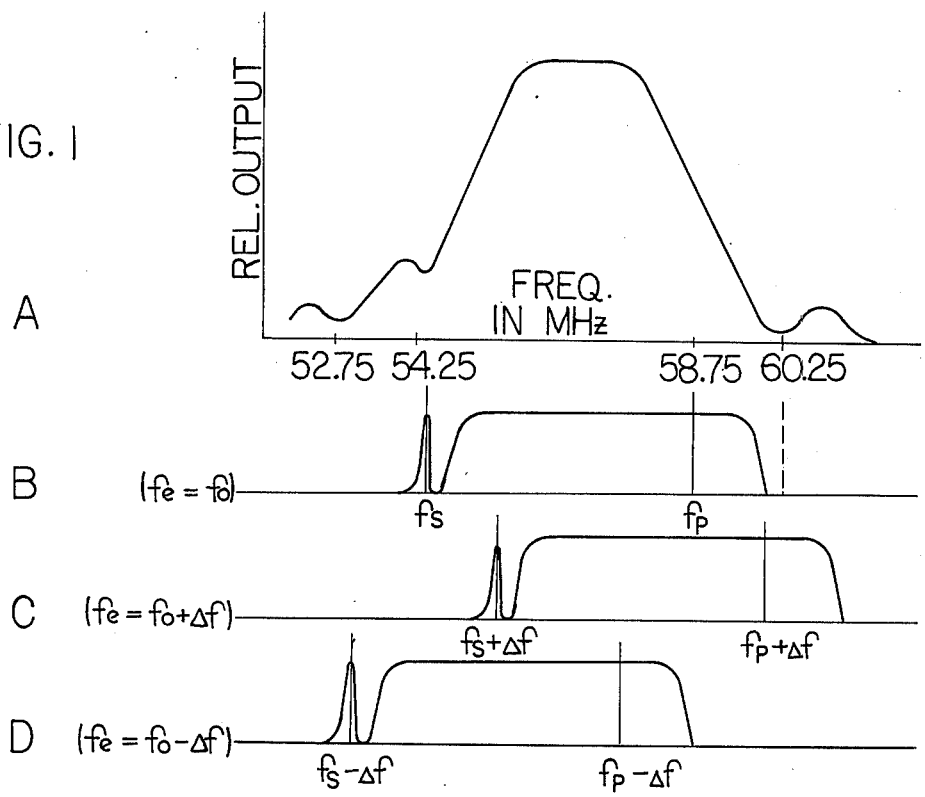
FIGS. 1A–1D show a typical television IF response curve and video spectra tuned in three different relationships to the IF curve.

FIG. 1A shows a typical frequency response curve for the IF circuit of a television receiver. The frequency indicated as 58.75mHz is the frequency of the video carrier and intersects the sloping part of the response curve at approximately the point 50% from the base to the top. The frequency 54.25 mHz is the frequency of the sound carrier of the same channel. At this frequency the response curve has a dip indicating a reduction in response to the sound carrier. The frequency 60.25 mHz is the frequency of the sound carrier in the next adjacent television channel. Because of the fact that signals reaching the IF circuit have had their frequencies reversed, the sound carrier at 60.25 mHz corresponds to the next lower channel, not the next higher channel as might be supposed. The fourth frequency indicated is 52.75 mHz and corresponds to the video carrier frequency of the next higher television channel. The response at this frequency is also very low to prevent interference from the next higher channel.

FIG. 1B shows the spectrum of a television signal properly tuned with respect to the response curve in FIG. 1A. That is, the video carrier $f_p$ in FIG. 1B is at the proper frequency of 58.75 mHz. This automatically places the sound carrier $f_s$ at the proper frequency of 54.25 mHz. The tuning that establishes the proper frequency relationship between the incoming signal and the IF amplifier is obtained by the local oscillator in the tuner, as is well known. In FIG. 1B the local oscillator frequency is $f_l$. The proper frequency $f_l$ to set any incoming channel to the proper relationship with respect to the IF amplifier is indicated by making $f_l = f_0$. For example, the proper frequency $f_0$ for television channel "4" in Tokyo is $f_0 = 230$ mHz.

If the frequency $f_l$ of the local oscillator is higher than it should be by an amount $\Delta f$, the tuner will not be properly set to place the incoming signal correctly with respect to the response curve of the IF amplifier. Because the tuner typically uses what is known as upper heterodyne whereby the local oscillator has a frequency higher than the frequencies in the desired television channel, an increase in $f_l$ to the point $f_0 + \Delta f$ causes the entire spectrum of the desired channel to be displaced higher as illustrated in FIG. 1C. On the other hand, if $f_l$ is lower than it should be so that $f_l = f_0 - \Delta f$, the entire incoming channel spectrum is displaced lower as shown in FIG. 1D.

When the tuner is properly set, the output signal of the IF amplifier is an amplitude-modulated signal of the type shown in FIG. 2A. This signal includes the usual synchronizing and blanking pulses, which, in this discussion, are the points of highest amplitude in the modulated signal. The video signal in the visible portion of each line interval is always between the black, or blanking level and the zero axis. There are standards to determine the various amplitudes relative to each other. For example, if the amplitude of the tips of the sync pulses relative to the zero axis is considered to be 1.0, the amplitude of the blanking level, or pedestal level, is 0.75. That is, the blanking or pedestal level is ¾ of the sync voltage, whatever that voltage may be.

Figure 2:
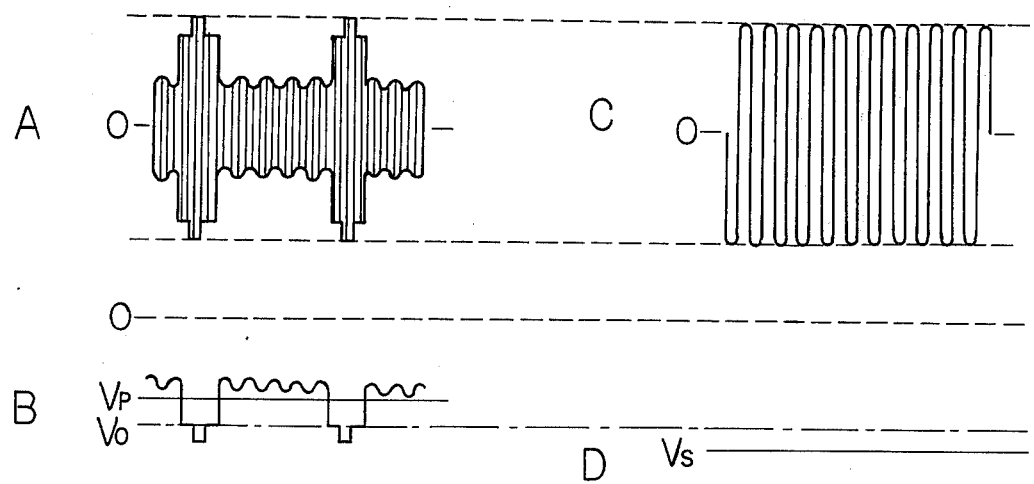
FIGS. 2A–2C show waveforms encountered in the operation of the circuit of this invention.

Typically, a video IF signal of the type shown in FIG. 2 is demodulated by a detector polarized to follow the negative portion of the envelope, as shown in FIG. 2B. Since the peak value is known, and the relationship between the peak value (in this case the negative peak value) and the pedestal level is also known, it is possible to determine the voltage level $V_o$ of the pedestal level. Furthermore, television receivers normally have AGC circuits that keep the peak-to-peak value of the amplitude modulated signal at a certain point, such as the output of the IF amplifier at a predetermined level. If the signal is somewhat weaker, the AGC circuit causes it to be amplified more highly and if it is too strong, the AGC circuit causes it to be amplified less. The result is that a relatively fixed voltage can be determined for the voltage $V_o$ for a properly tuned video signal.

As shown in FIG. 2B, the average value of the detected video signal, illustrated by the value $V_p$, is lower in magnitude than the pedestal level $V_o$. Since the signal under consideration is a negative signal, this lower magnitude means that the average picture level (APL) $V_p$ is less negative, or more positive, than the pedestal level $V_o$. Of course, with negative demodulation, the level $V_p$ can never actually go past the zero axis. Furthermore, the exact level $V_p$ varies with the video content. If the television picture were entirely white, the level $V_p$ would be much closer to the zero axis than is shown in FIG. 2B. On the other hand, if the picture were entirely black, the level $V_p$ would drop almost to the pedestal level $V_o$, but in any case the level $V_p$ is always somewhere between the level $V_o$ and the zero axis for a properly tuned television signal.

If the television tuner is tuned to a lower frequency than it should be, as shown in FIG. 1D, the high frequency components of the video signal are not amplified as much as they should be, but the low and middle frequency components are amplified quite strongly. As a result, the APL voltage $V_p$ is higher (that is, less negative in the case of negative envelope detection) than the pedestal level $V_o$. On the other hand, when the tuner is tuned to a higher frequency than it should be by, for example, more than 1 mHz as shown in FIG. 1C, the middle and lower frequency components of the video signal are decreased and the level of the sound carrier is increased because it passes through a relatively high amplification part of the IF response curve in FIG. 1A. The effect of the AGC circuit is still to maintain the peak-to-peak amplitude of whatever signal is passing through the video IF amplifier at a fixed level. This is illustrated in simplified form in FIG. 2C which shows a simple unmodulated signal of constant amplitude. Actually, this signal includes the sound carrier and some part of the video signal so that its amplitude would not be exactly fixed but would still be much more so than the pulse type signal of a typical video signal as shown in FIG. 2A. This mistuned constant amplitude signal of FIG. 2C is still subject to envelope detection, just as if it were a proper television signal. Since the envelope is simply a fixed level, or is substantially so, the resulting detected signal as shown in FIG. 2D is a virtually straight line at the voltage level $V_s$ that corresponds to the peak value of the sync pulses in the signal illustrated in FIG. 2A.

Accordingly, if the APL level $V_p$ of the negative polarity detected output of the IF amplifier is higher than the pedestal level $V_o$, the oscillating frequency $f_i$ is lower than or almost equal to the desired frequency $f_o$.

On the other hand, if the pedestal level is greater than the APL level, as when the latter is $V_p$, the frequency $f_1$ is higher than the frequency $f_o$.

By comparing the APL level with the pedestal level $V_o$, a first detecting signal can be obtained which can have only two values and can be formed in the entire frequency band of the local oscillator in the television tuner. However, this first detecting signal, alone, does not contain enough information, to control the frequency of the local oscillator. A second detecting signal is required and is obtained by applying the video IF signal to a frequency discriminator tuned to the desired frequency $f_o$. The combination of these two detecting signals makes it possible for wide band AFT operation to be obtained. The first and second detecting signals that control the tuner are switched according to whether or not the frequency of the received signal is close to the desired frequency.

A third detecting signal is useful when the frequency $f_i$ of the local oscillator shifts too far from the desired frequency, for example, 4 mHz lower or 3 mHz higher than $f_o$. The third detecting signal is obtained by detecting noise components in the audio frequency circuit and using these detected noise components to disable the AFT operation.

The third detecting signal is particularly useful when there is no incoming signal, such as after the transmitter of the desired channel has gone off the air for the night or even because of a short breakdown. The same condition is obtained if there is a break between the antenna and the television receiver. In any such loss of signal, the tuner could shift far out of the controllable range of AFT operation. However, the third detecting signal prevents such mistuning and keeps the tuner within a range that allows the tuner to be returned to the desired frequency after the interrupted signal is again received.

Figure 3:
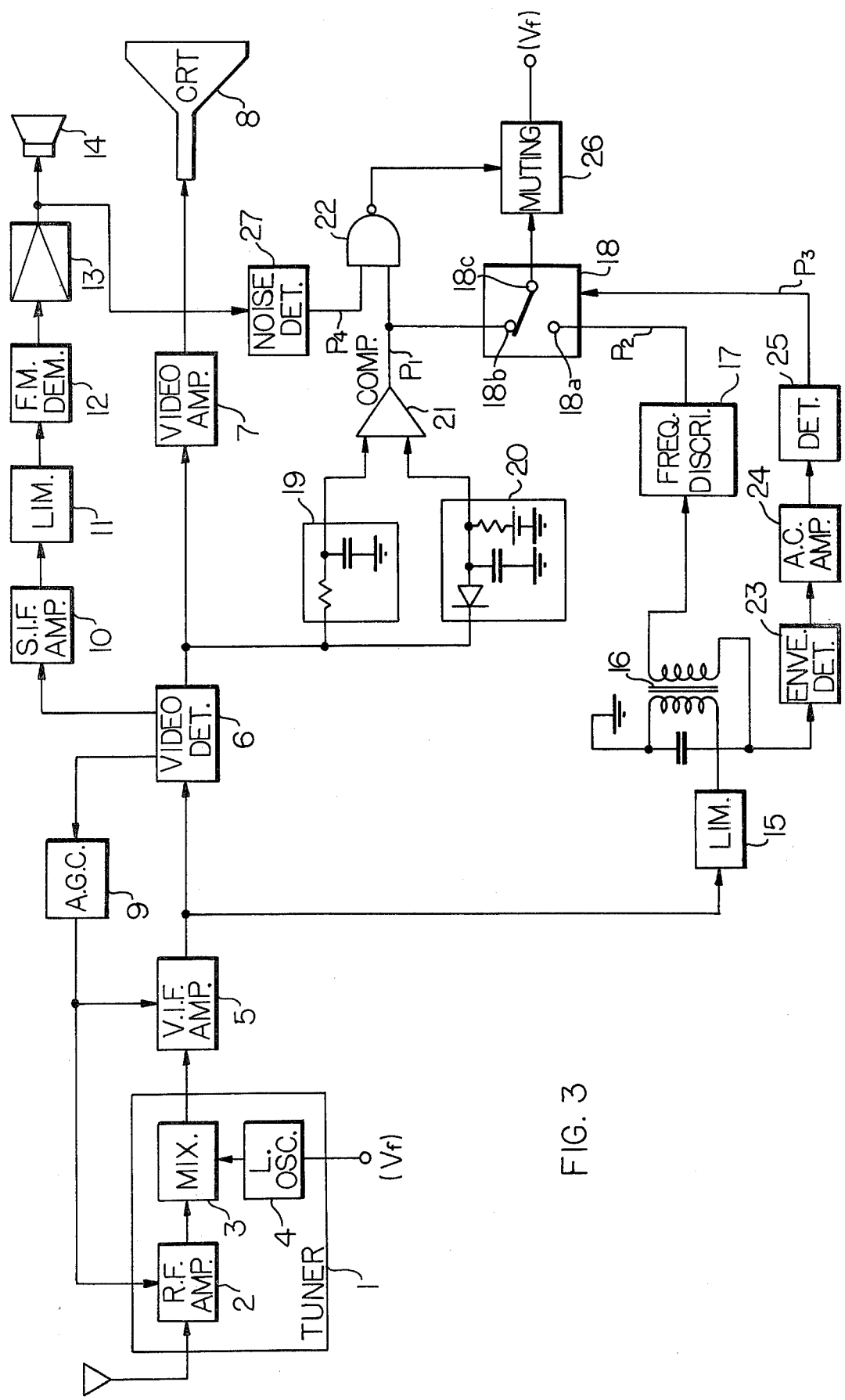
FIG. 3 is a basic block diagram of a television receiver incorporating the invention.

FIG. 3 shows a simplified diagram of a television receiver omitting circuits relating to color, since these circuits play no part in this invention. However, the invention may be equally useful in television receivers capable of color reception as well as black and white reception. The circuit in FIG. 3 includes a tuner 1 that comprises an RF amplifier 2, a mixer 3, and a local oscillator 4. These may be standard components except that the local oscillator must be capable of being tuned by a tuning voltage $V_f$.

The circuit also includes a video IF amplifier 5 connected to the output of the mixer 3 and having its own output connected in turn to a video detector 6. A video amplifier 7 connects the output signal of the detector 6 to a cathode ray tube 8.

An AGC circuit that automatically controls the gain of the RF and IF sections of the receiver is connected to the detector 6 and has outputs connected to the RF amplifier 2 and the video IF amplifier 5.

The audio section of the receiver, which is an intercarrier sound type of receiver, includes a sound IF amplifier 10 connected to receive signals from the video detector 6. The output of the amplifier 10 is connected to a limiter 11 which, in turn, is connected to an FM demodulator 12. The output of the demodulator is connected through an audio frequency amplifier 13 to a speaker 14.

The video frequency IF amplifier 5 is also connected to a limiter 15 to supply the video frequency amplifier modulated signal thereto. A circuit 16 tuned to the desired video IF carrier, which has been referred to previously as having a frequency of 58.75 mHz connects the limiter 15 to a frequency discriminator 17. The output of the discriminator 17 is connected to a switching circuit 18 that corresponds to a single-pole, double-throw switch. Specifically, the discriminator 17 is connected to one of the fixed terminals 18a of the switching circuit.

The circuit for obtaining the first detecting signal includes an average level detecting circuit 19, which smooths out the envelope detected signal from the video detector 6. A peak detector 20 is also connected to the video detector 6 to receive the envelope detected signal therefrom. The detector 20 includes a biasing voltage so that the output level of this detector has the voltage $V_o$ of the pedestal level. The outputs of the circuits 19 and 20 are connected to the two input terminals of a voltage comparator 21 and the output voltage of this comparator is the voltage $P_1$, which is the first detected signal previously referred to. This signal is connected to one input terminal of a NAND gate 22.

The tuned circuit 16 also connects the output signal of the limiter 15 to an envelope detector 23. The output of this detector is connected to an amplifier 24 that preferably amplifies alternating voltage signals rather than direct voltage signals. The amplifier 24 is connected to a detector 25, the output of which is connected to actuate the switching circuit 18.

A second fixed terminal 18b of the switching circuit 18 is connected to the output of the comparator 21, and the arm 18c of the switching circuit which can make contact with either of the two fixed terminals 18a or 18b, is connected to a muting circuit 26, the output terminal of which is the source of the tuning voltage $V_f$ for the local oscillator 4.

Finally, the circuit in FIG. 3 includes a noise detector 27 connected to the output of the audio amplifier 13. The noise detector distinguishes noise signals from audio signals on the basis that the noise signals are primarily high frequency signals and so the detector 27 may include a high pass filter followed by a rectifier. The output of the noise detector is connected to the other input terminal of the NAND gate 22.

The operation of the circuit in FIG. 3, insofar as the tuner and other components that are standard in television receiver circuits need not be described in detail. The voltage responsive tuning element in the local oscillator 4 may be, for example, a variable capacitance diode, the capacitance of which is controlled by the voltage $V_f$ applied as a reverse bias to the diode. Such tuners are described in more detail in the above-mentioned companion cases.

Figure 4:
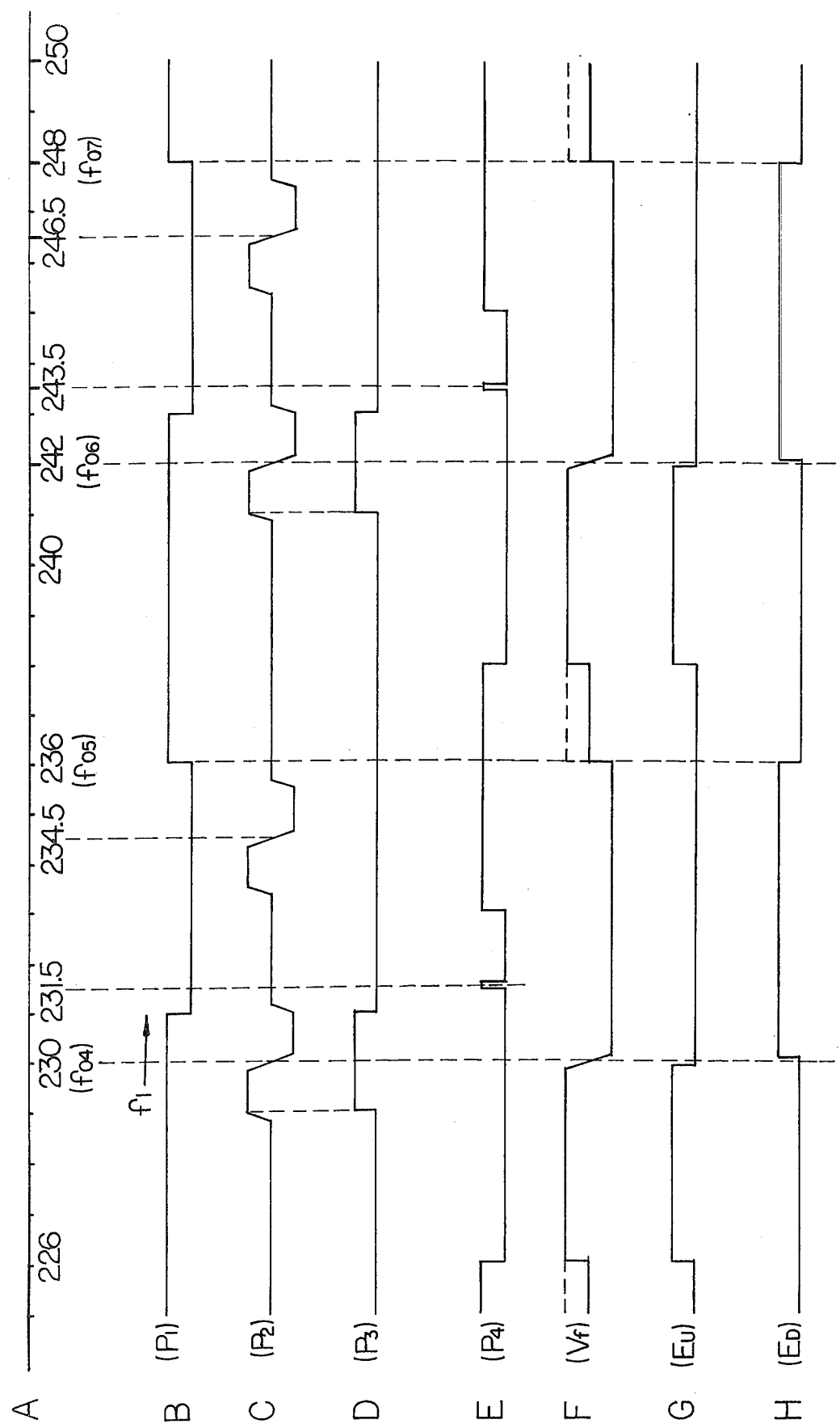
FIGS. 4A–4H are frequency response curves of various sections of the circuit in FIG. 3.

The operation of the circuit in FIG. 3 will be described in connection with the frequency response curves in FIG. 4.

FIG. 4A represents a section of the total frequency band over which the local oscillator 4 in FIG. 3 is tuned in order for the receiver to receive channels 4 through 7. In order to receive these channels the frequency is indicated as being shifted between about 225mHz and about 250mHz. The video carrier frequency of channel 4 is $f_{04}$, which is equal to 230mHz. The sound carrier for channel 4 is 234.5 mHz. It will be assumed that no transmitter is located on channel 5, although if there were such a transmitter its video carrier would be frequency $f_{05}$ which is equal to 236mHz. The next channel actually available for reception is channel 6 which has a video carrier frequency $f_{06}$ at 242mHz and a sound carrier at 246.5mHz. The video carrier of channel 7 would, if it were present, be at the frequency $f_{07}$ which is equal to 248mHz. It is to be understood that the frequencies given are those suitable to convert the actual channel frequencies to the IF band illustrated in FIG. 1.

The operation of the level detecting circuit 19 is such that the output amplitude becomes higher than the reference voltage $V_o$ when the frequency $f_l$ of the local oscillator 4 is lower than or almost equal to the frequency $f_o$. The output of the voltage comparator 21 is a logic signal that takes on the logic level "1" when the output voltage of the circuit 19 becomes higher than the reference voltage $V_o$. Conversely, when the frequency $f_l$ is higher than the frequency $f_o$ by more than approximately 1mHz, the output voltage of the comparator 21 takes on the low logic level "0". The output voltage $P_1$ of the comparator 21 is illustrated in FIG. 4B.

The output signal of the frequency discriminator 17 is the previously mentioned second detecting signal to cooperate in controlling the operation of the oscillator 4. This signal is identified as the signal $P_2$ in FIG. 4C.

The third detecting signal $P_4$ shown in FIG. 4E and mentioned previously is the output of the noise detector 27 and has the logic value "1" if there is a high noise level and a logic value "0" if the local oscillator 4 is turned sufficiently close to the proper frequency to allow an audio signal to be derived through the audio section of the receiver.

The final control signal is a signal $P_3$ at the output of the detector 25 and may be referred to as an AFT selecting signal. The signal $P_3$ controls switching circuit 18 so that the output of the latter is the signal $P_2$ when $P_3 =$ "1" and the output of circuit 18 is the signal $P_1$ when $P_3 =$ "0". It has the logic value "1" if the frequency $f_l$ of the local oscillator 4 is defined by $f_l = f_o \pm$ 1mHz. Outside this frequency range, the AFT sum signal $P_3$ has the logic value "0". The output signal of the switching circuit 18 is basically the AFT signal $V_f$ and is applied to the muting circuit 26. The output signal of the muting circuit controlled by the output of the NAND gate 22 is the actual AFT signal $V_f$ shown in FIG. 4F and applied to the local oscillator 4.

The NAND circut 22 is partly controlled by the output signal $P_4$ from the sound-noise detecting circuit 27 and partly controlled by the first detecting signal $P_1$ from the voltage comparator 21. The signal $P_4$ from the noise detector 27 has the value "1" when there are substantial noise components and the value "0" when the tuning of the oscillator 4 is sufficiently close to a correct value so that the sound portion of the receiver receives more audio signals and less noise components. The muting circuit 26 is held operative when the output of the NAND circuit 22 is "0". When the muting circuit is operative, the AFT voltage $V_f$ has the predetermined value, and the control of the oscillating frequency of the local oscillator is stopped.

It will be noted in FIG. 4E that the output signal of the amplifier 13 is predominantly a noise signal and appears continuously when the received signal frequency shifts from the desired frequency corresponding to proper tuning of the oscillator 4. However, such shift, in order to produce a noise signal must be more than 4mHz lower or more than 3mHz higher than the desired frequency. It will be noted that there is a noise signal from the detector 27 when the frequency of the local oscillator $f_l$ shifts from the proper frequency to correspond to the video carrier, for example 230mHz, by 1.5mHz as shown in FIG. 4E. The reason that this noise signal appears at that point is because the level of the video carrier is greatly attenuated by the trap in the IF amplifier that traps out the sound carrier of the lower adjacent channel in the overall frequency response of the video IF amplifier 5. In FIG. 1 this trap frequency is shown at 60.25mHz for a video IF carrier of 58.75 mHz. Since the receiver is an intercarrier sound receiver, which requires a video IF signal in order to operate, the effect of trapping out the video carrier by shifting the local oscillator frequency by 1.5mHz above its proper value is to make it impossible to receive an audio signal and thus what remains is noise.

Figure 5:
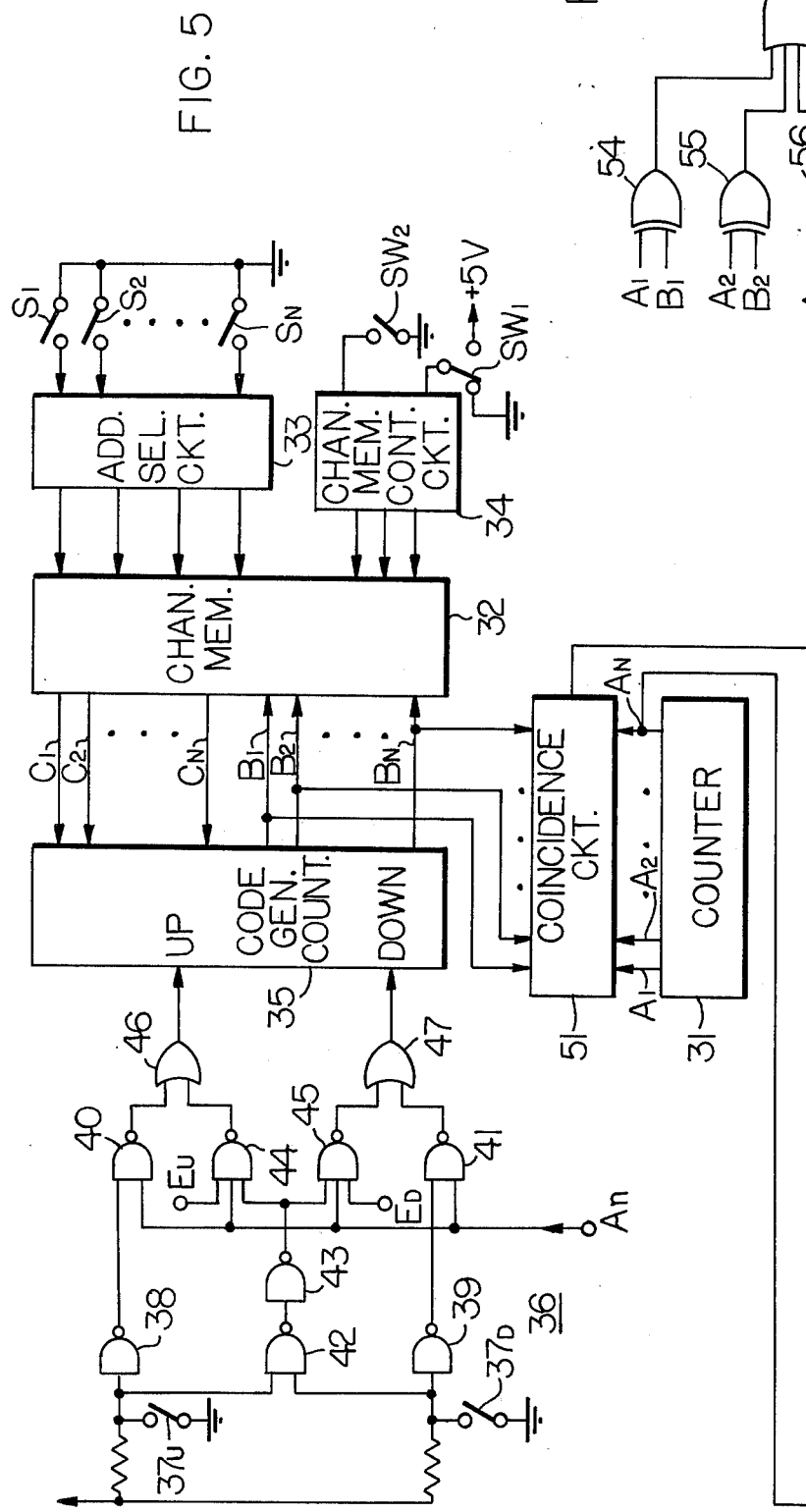
FIG. 5 is a block diagram of a television receiver with an electronically tuned tuner arranged to be controlled by digital signals.

The third detecting signal $P_4$ and the first detecting signal $P_1$ supplied to the NAND gate 22 allow the output of the NAND gate to be "0" only when both of its input signals are "1". Under such condition the muting circuit 26 is held operative. Therefore, the AFT signal $V_f$ is a combination of the first and second detecting signals $P_1$ and $P_2$, and the portion of this signal $V_f$ shown in broken lines in FIG. 4F is the muted portion. The AFT operation extends over a wide range from about −4mHz below the desired video carrier frequency to +3mHz above the video carrier frequency. This is illustrated in FIG. 4F with respect to the frequencies $f_{04}$ and $f_{06}$ for the two available television channels. The voltage level corresponding to the "0" level of the first detecting signal $P_1$ is selected to be the same as the lowest level of the second detecting signal $P_2$. Furthermore, when there is no incoming signal, as will be indicated by a high noise component appearing continuously at the noise detector 27 and causing the output of the latter to have the value "1", the AFT operation is disabled. The illustrated embodiment in FIG. 3 is applicable to a tuner 1 that has a mechanical channel selector and operates with an analog AFT voltage $V_f$. However, the invention is also applicable to an electronically tuned tuner that uses electronic channel selection and has no potentiometer for forming the tuning voltage. FIG. 5 shows this type of electronic channel selector.

FIG. 5 shows a circuit in which the channel code generating, recording, and identification portions are similar to those in U.S. Patent Application Ser. No. 716,655 now U.S. Pat. No. 4,085,371. The circuit includes a timing counter 31 by means of which an n-bit code is formed by sequentially dividing the frequency of output pulses $A_1$-$A_n$ of the counter. The circuit also includes a channel memory 32 that has N addresses, each of which is capable of recording a digital code that corresponds to a single channel and also corresponds to the digital signal which, when used to govern the generatiion of an analog signal, controls the tuning of an electronic tuner 1. The memory portion per se is nonvolatile in the sense that the digital information recorded therein is retained even if the circuit is disconnected from a power source.

An address selecting circuit 33 is connected to the memory 32 and is provided with a group of switches $S_1$-$S_N$ corresponding to each of the memory addresses, or to the received channels. A channel memory control circuit 34 is provided with a mode control switch $SW_1$ and a writing switch $SW_2$. The switch $SW_1$ has a writing mode which may also be referred to as a programming mode, to control the channel memory 32 to have channel identification codes recorded therein at addresses selected by the switches $S_1$-$S_n$. The switch $SW_1$ also has a read out mode, which may be called a channel selecting mode, and when the circuit 34 is in that mode, the selection of any address in the channel memory 32 by means of the switches $S_1$-$S_N$ causes the digital code to be read out so as to effect actuation of the tuning element in the tuner 1 to cause the tuner to be set to the corresponding channel. The writing mode is further controlled by the writing switch $SW_2$ to cause the circuit 34 to signal the channel memory 32 to erase any previously recorded code at an address selected by one of the switches $S_1$-$S_N$ and to write a new code at that address depending on actuation of a code generation section of the circuit to be described hereinafter.

One of the components for generating an address code is a channel selecting code generating counter 35. In the programming mode, the counter 35 counts a series of tuning pulses to produce an n-bit channel selecting code $B_1$-$B_n$ to be delivered to the channel memory 32. After programming has been accomplished, a channel selection is carried out by producing an n-bit channel selecting code $C_1$-$C_n$ to be readout from the channel memory 32 and applied to the channel selecting code generating counter 35, where the n-bit code appears as an output code $B_1$-$B_n$.

The counter 35 is controlled by a pulse controlling circuit 36. This circuit comprises an up-tuning switch 37U and a down-tuning switch 37D. These are connected between ground and a respective resistor for each of the two switches, and the two resistors are connected to a positive power supply terminal. A "0" signal is obtained at either of the switches 37U or 37D when that switch is closed. The outputs of these two switches are connected to inverters 38 and 39, respectively. The output of the inverter 38 is connected to one input terminal of a NAND circuit 40 and the output of the inverter 39 is connected to one input terminal of another NAND circuit 41. The input terminals of the inverters 38 and 39 are also connected to the two input terminals of a NAND circuit 42. The output of this NAND circuit is connected through an inverter 43 to one input terminal of each of a pair of NAND circuits 44 and 45.

The most significant bit output terminal of the counter 31, the terminal at which a pulse signal $A_n$ having a period T is produced, is connected through a terminal $A_n$ to one input terminal of each of the NAND circuits 40, 41, 44, and 45. The output terminals of the NAND circuits 40 and 44 are connected to input terminals of an OR circuit 46, the output terminal of which is connected to the UP, or up-counting, terminal of the counter 35. The output terminals of the NAND circuits 41 and 45 are connected to input terminals of another OR circuit 47, the output terminal of which is connected to the DOWN, or down-counting, terminal of the counter 35.

The basic components of the television circuit in FIG. 5 are similar to those in FIG. 3 and need not be described again. An AFT circuit 50 is connected to the output of the IF circuit 5 and has two output terminals $E_U$ and $E_D$ from which correspondingly identified control signals are derived to effect automatic fine tuning control of the tuner 1. The terminal $E_U$ of the AFT circuit 50 is connected to an input terminal $E_U$ of the NAND circuit 44 and the terminal $E_D$ of the AFT circuit 50 is connected to the input terminal $E_D$ of the NAND circuit 45.

The circuit in FIG. 5 further includes a coincidence circuit 51 connected to output terminals of the counter 35 to have a digital code of that counter impressed on the circuit 51. The coincidence circuit also has corresponding output terminals of the counter 31 connected to it so that the coincidence circuit can compare the output code $B_1$-$B_n$ of the counter 35 with the output count $A_1$-$A_n$ of the counter 31 to produce a response when the count $A_1$-$A_n$ is exactly equal to the code $B_1$-$B_n$. The output of the coincidence circuit 51 and the output of the highest significant bit of the counter 31 are connected to RESET and SET terminals, respectively, of a flip-flop 52. The pulse signal PW of the flip-flop 52 is applied to a low pass filter 53, the output of which is the voltage to control the tuner 1.

Figure 6:
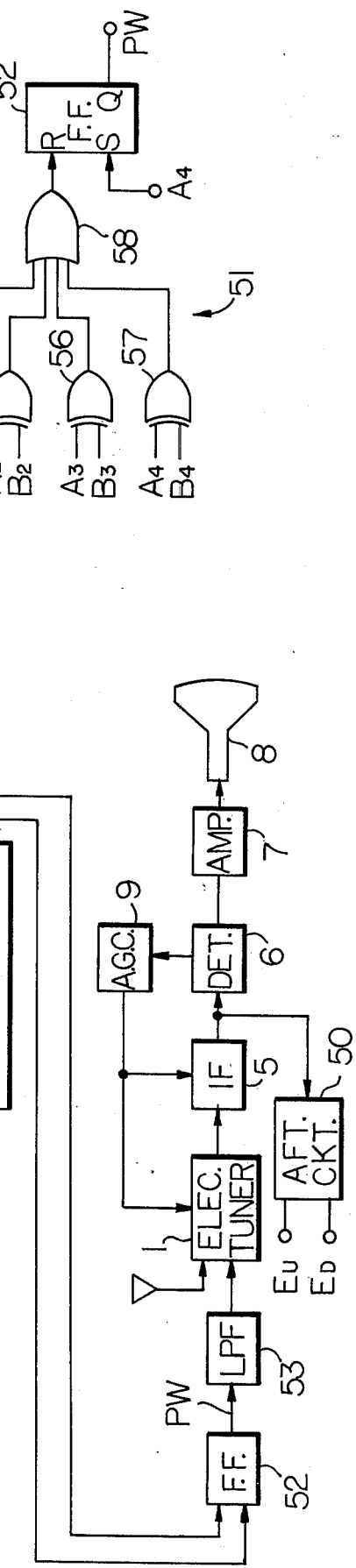
FIG. 6 is a block diagram of one part of the circuit in FIG. 5 in greater detail.

The coincidence circuit 51 is shown in more detail in FIG. 6. For sake of simplicity, FIG. 6 shows a coincidence circuit in which there are only four bits. This would mean that if the circuit in FIG. 6 were actually used in that form in the circuit in FIG. 5, the subscript n with respect to the code $B_1$-$B_n$ and the count $A_1$-$A_n$ would be equal to 4. In practice, the coincidence circuit would normally compare a 14 digit code with a 14 digit count.

The coincidence circuit in FIG. 6 includes $n(=4)$ exclusive OR circuits 54-57. Each of the exclusive OR circuits 54-57 has two inputs $A_1$-$A_4$ connected to corresponding outputs of the counter 31 in FIG. 5 and $B_1$-$B_4$ connectec to corresponding outputs of the counter 35 in FIG. 5. These circuits are characterized by having a "0" output if the two inputs are identical to each other and a "1" output if the two inputs are not identical. The output terminals of the four exclusive OR circuits 54-57 are connected to an OR circuit 58, the output of which is connected to the RESET terminal of the flip-flop 52.

The highest significant bit signal from the counter 31 is $A_4$, and this signal is connected to the SET terminal. As indicated the output signal of the flip-flop 52 is the pulse signal PW.

Figure 7:
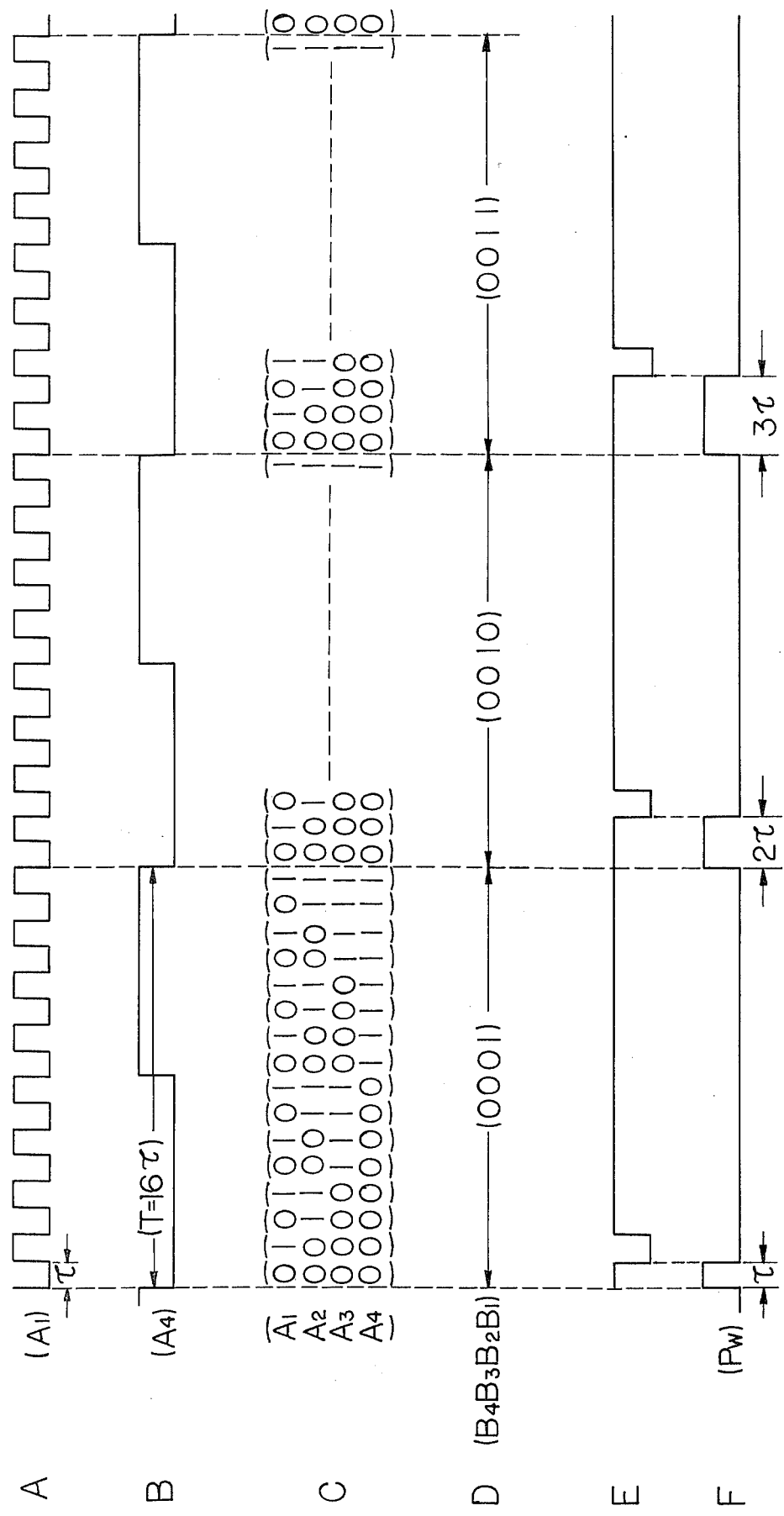
FIGS. 7A–7F are waveforms encountered in the operation in FIG. 5 and also include digital identification of various points in the waveform.

In the operation of the coincidence circuit 51 in FIG. 6, the pulses and counts in FIGS. 7A–7E are obtained. The counter 31 of FIG. 5 supplies to the input terminal $A_1$ of FIG. 6 a repetitive pulse signal indicated in FIG. 7A. This signal has the shortest period $\tau$, and the longest interval, which is that of the pulse $A_4$ shown in FIG. 7B is T which is equal to $16\tau$. The periods of the pulses $A_2$ and $A_3$ have a period between that of the pulse $A_1$ and that of the pulse $A_4$. At the end of each interval $\tau$ the signal $A_1$ reverses its polarity, at the end of the interval $2\tau$ the pulse $A_2$ applied to the exclusive OR circuit 55 reverses its polarity, and so on up to the signal $A_4$ applied to the exclusive OR circuit 57, which reverses its polarity at the end of $8\tau$ giving the latter a total period of $16\tau$.

The range of polarity of at least one of the signals $A_1$–$A_4$ applied to the exclusive OR circuits 54–57 is indicated numerically in FIG. 7C in which the count is displayed from 0000 to 1111.

The code $B_1$–$B_4$ applied to the exclusive OR circuits 54–57 has a value within the range of 0000 through 1111. Assuming that the code $B_1$–$B_n$ remains constant while the outputs $A_1$–$A_4$ of the counter 31 count from 0000 to 1111, a binary number will be reached at which the count $A_1$–$A_4$ is identical with the code $B_1$–$B_4$. To use a specific example, let it be assumed that the code $B_1$–$B_4$ is 1000. As the counter starts from 0000, at least one of the exclusive OR circuits 54–57 will have unequal input signals applied to it, and this will have an output of "1". At the start when the count is 0000 only the exclusive OR circuit 57 has different values applied to its input. Each of the exclusive OR circuits 54–56 has a "0" at both of its A and its B inputs and thus each of these three exclusive OR circuits has a "0" output. Since the code $B_1$–$B_4$ is assumed to be 1000, the initial value of "0" for the signal $A_4$ is different from the value "1" of the code $B_4$. Therefore, the output of the exclusive OR circuit 57 is "1" which makes the output of the OR circuit 58 "1". As the count proceeds up to the value 0111 the output of the OR circuit 58 remains "1", but when the next change of polarity of the signal $A_1$ occurs, the count reaches 1000 and is therefore coincident with the code $B_1$–$B_4$ of 1000. This causes all of the exclusive OR circuits 54–57 to have a "0" output, and for the first time, the OR circuit 58 also has a "0" output. The flip-flop 52 is of a type to be reset when the output of the OR circuit 58 goes from "1" to "0" so it is reset at this instant.

When it is reset, the output pulse PW goes from "1" to "0". The flip-flop 52 is set at the occurrence of the count $A_4$ from the counter 31 in FIG. 5. Thus, as shown in FIG. 7F, the leading edge of the pulse PW begins at the time the count $A_4$ goes from its "1" value to its "0" value. The pulse PW remains at the "1" value from the time it is initiated until the time of coincidence of the count $A_1$–$A_4$ and the code $B_1$–$B_4$. At that instant, the "0" output of the OR circuit 58 resets the flip-flop 52 and terminates the pulse PW. In FIG. 7D a code $B_4,B_3,B_2,B_1$ (so stated to place the most significant bit farthest to the left) is 0001. Thus, the count of the counter 31 reaches coincidence with this code at the end of the first interval $\tau$ shown in FIG. 7A and causes the output of the OR circuit 58, which is represented in FIG. 7E to drop from "1" to "0", thereby resetting the flip-flop 52 and terminating the first pulse PW.

If the code is 0010, as shown in the central part of FIG. 7D, coincidence will be reached when the count $A_1$–$A_n$ is also 0010 as shown in FIG. 7E and the pulse PW as shown in FIG. 7F will have a width of $2\tau$. In the right hand section of FIGS. 7D–7F the conditions are such as to create a pulse PW having a width $3\tau$ and this illustrates that the width of the pulse PW can be any number of $\tau$ up to 16.

The counting by the counter 31 does not stop when coincidence is reached in any given count. The counter 31 continues to count through to its highest value 1111 and then starts over at 0000. Thus for any code $B_1$–$B_n$ there will be a repetitive pulse PW produced by the flip-flop 52 and at each repetition this pulse will have a width of the approximate number of $\tau$ as determined by the code $B_1$–$B_4$. The higher the number of $\tau$ the wider the pulse PW. Since this pulse is smoothed out by a low pass filter to produce a direct voltage equal to its average value, the greater the number of $\tau$, the greater the average value will be. This average value signal, which is an analog signal, is the tuning signal for the tuner 1 and is thus controlled by the code $B_1$–$B_n$.

Applying the foregoing operation to the circuit in FIG. 5, the receiver may initially be set into operation (or reset at any time) by placing the switch $SW_1$ in the writing condition. This causes the channel memory control circuit 34 to apply an appropriate writing signal to the channel memory 32. A specific address in the memory 32 is selected by closing one of the switches $S_1$–$S_N$ to actuate the address selecting circuit which, in turn, selects a specific memory address in the channel memory 32. The writing condition is applied to this address.

For the sake of clarity, it may be assumed that the first address corresponds to the switch $S_1$ and that the receiver is located in an area that receives channel 1, although it is not necessary that the switch $S_1$ correspond to channel 1 since it can equally well correspond to channel 2 or another other channel.

Further assuming that the counter 35 is in its RESET condition so that its output $B_1$–$B_n$ is 0000, and the frequency to which the tuner 1 is therefore tuned, is too low to receive channel 1, the up-tuning switch 37U must be closed. This places a "0" on the input of the inverter 38 which therefore places a "1" on the upper input terminal of the NAND circuit 40. The counter 31 counts through its range of values and at the count $A_n$ applies a count pulse to the NAND circuit 40. The output signal of this NAND circuit passes through the OR circuit 46 to the up input terminal of the counter 35, thereby causing the output code $B_1$–$B_n$ to go from 0000 to 0001.

If this code produces a tuning voltage that still is not high enough to tune the tuner to channel 1, the up-tuning switch 37U may be kept closed while the counter 31 makes another cycle and generates another signal $A_n$ to increase the count of the counter 35 by one more step. This brings the output code of the counter to 0010. This stepping up of the count in the counter 35 continues until a voltage is produced by the filter 53 to tune the tuner 1 at least close to the proper frequency to receive channel 1. The frequency can be tuned in precisely by means of the up-tuning switch 37U and, if necessary, the down-tuning switch 37D. The frequency can also be adjusted to the condition of best tuning by means of the AFT circuit 50. After the tuning is correct, the writing switch $SW_2$ is closed to record the proper code $B_1$-$B_n$ from the counter 35 at the previously selected address of the channel memory 32. Operation of the channel memory control circuit 34 is such that before a new code is written at a particular address, any previously written code at that address is erased.

The circuit may then be programmed to record the digital code for another channel at another address by repeating the operation just described by actuating a different switch, for example the switch $S_2$, to select a different channel address in the channel memory 32. This recording of channel codes $B_1$-$B_n$ may be continued either until all of the available channel codes have been recorded or until there are no more available addresses in the channel memory 32. The channel memory control circuit 34 is then returned to a condition to read out the code in which ever channel memory address is selected by one of the switches $S_1$-$S_N$.

In reading out an existing address, actuation of one of the switches $S_1$-$S_N$, for example switch $S_2$, causes the channel memory 32 to supply the code at that address to the counter 35 by way of the connections $C_1$-$C_n$. This code is then impressed immediately on the output terminals as the code $B_1$-$B_n$ and is also impressed on the coincidence circuit 51. Thereafter, the counter 31 can, in its first cycle of operation, reach the proper coincidence to cause the flip-flop 52 to generate a pulse PW of the proper duty cycle, or duration, to change the tuning of the electronic tuner 1 to the selected channel.

Figure 8:
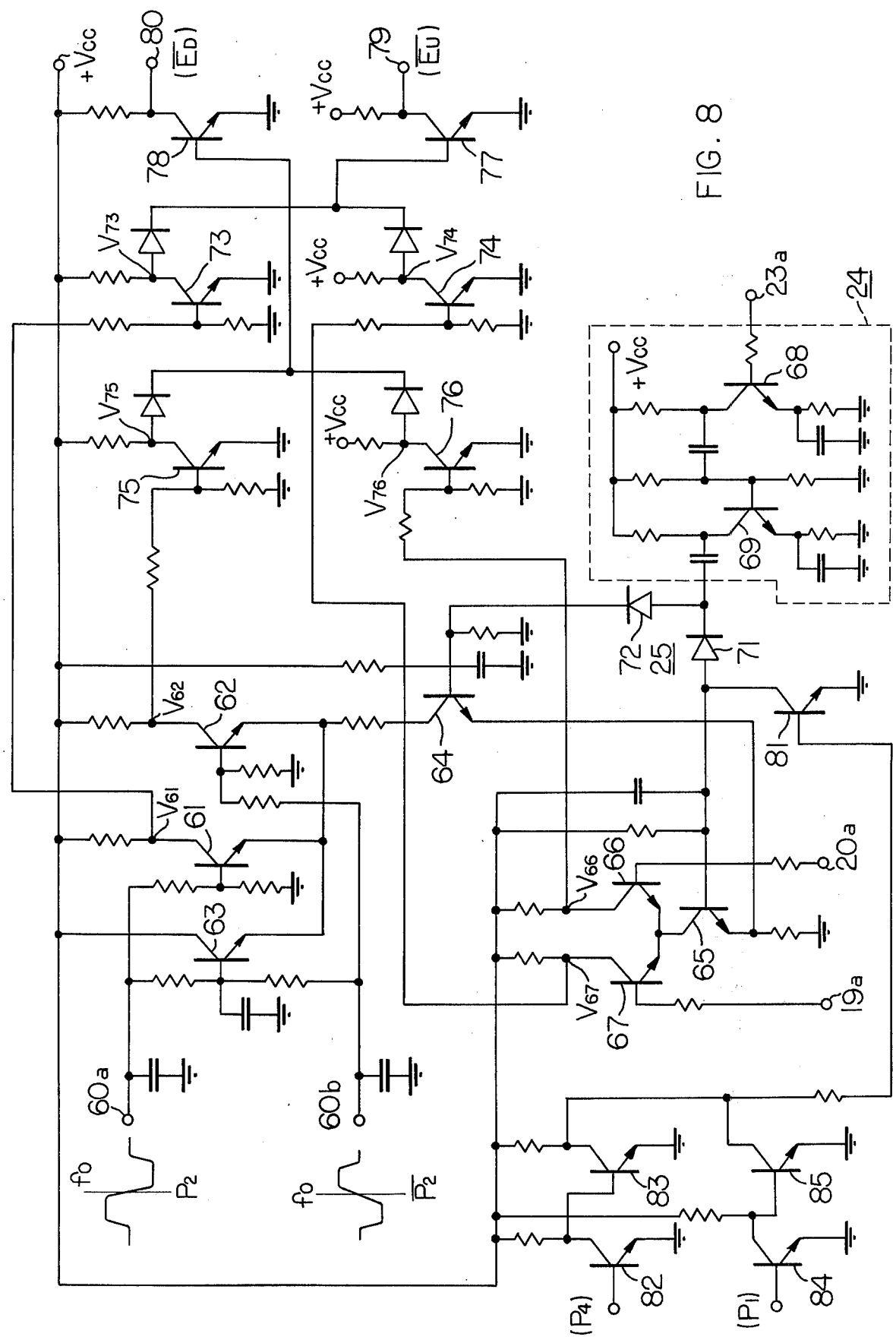
FIG. 8 is a schematic circuit diagram of one embodiment of the invention to generate control signals for digital operation.

The AFT circuit 50 in FIG. 5 is shown in greater detail in FIG. 8, and the waveforms associated with operation of that circuit are shown in FIGS. 9A-9K. FIG. 8 has an input terminal 60a to which the second detecting signal $P_2$, shown in FIG. 4B, is applied. The circuit has another input terminal 60b to which a signal $P_2$ is supplied. The input terminal 60a is connected to the base of a transistor 61 and the terminal 60b is connected to the base of a transistor 62. Both of the input terminals are connected to the base of a transistor 63 by way of a circuit that adds the signals $P_2$ and $P_2$. The emitters of all three of the transistors 61-63 are connected together and are connected through a resistor to the collector of a transistor 64. The latter transistor and another transistor 65 have their emitters connected directly together and grounded through another resistor so that these two transistors form a differential amplifier in which only one of the transistors 64 and 65 is conductive at a time. The transistor 65 is connected in the common emitter lead of a second pair of differentially connected transistors 66 and 67. When the transistor 64 is conductive, the transistors 61-63 are biased to an operative condition. The emitter voltages of the transistors 61 and 62 are determined by the voltage at the emitter of the transistor 63, so that transistors 61 and 62 operate as a kind of clipping circuit, or slicer. FIG. 9A shows the collector voltage $V_{61}$ of the transistor 61. The waveform of this voltage is shaped so that it is a low level when the local oscillating frequency $f_l$ is lower than the frequency $f_o$ that would correspond to the correct tuning frequency for selecting a desired channel. The voltage $V_{61}$ at the collector of the transistor 61 is at its low value when the frequency $f_l$ is between 50kHz and 1mHz below the correct frequency $f_o$.

The transistor 62 is controlled by the signal $P_2$ in the same way that the transistor 61 is controlled by the signal $P_2$. Because of the reverse polarity of the signal controlling the transistor 62, the collector voltage $V_{62}$ of this transistor is shown in FIG. 9C as having a low level when the frequency $f_l$ of the oscillator is between 50kHz and about 1mHz above the desired frequency $f_o$.

The circuit in FIG. 8 further includes the AC amplifier 24 shown in FIG. 3. This amplifier includes two transistors 68 and 69 which are capacitively coupled. The base input terminal of the transistor 68 receives the output signal of the envelope detector 23 (FIG. 3) by way of an input terminal 23a.

The detecting circuit 25 of FIG. 3 is shown in FIG. 8 to be formed by two diodes 71 and 72 capacitively connected to the output of the amplifier 24. When the video signal is applied to this detecting circuit as the input signal, the base of the transistor 64 has a higher voltage than the base of the transistor 65 so that the transistor 64 is conductive and the transistor 65 is nonconductive. When the input to the amplifier 24 is a direct voltage obtained from the envelope detected output of the sound carrier, the base of the transistor 65 has a higher voltage than that of the transistor 64, which makes the transistor 65 conductive and the transistor 64 nonconductive. Thus the transistors 64 and 65 correspond to the switching circuit 18 controlled by the AFT sum signal $P_3$ in FIG. 3.

As shown in FIG. 9E, when the frequency of the local oscillator 4 in FIG. 3 is tuned within ± 1mHz of the proper frequency $f_o$ corresponding to the video carrier of the desired channel, the transistor 64 is conductive. When the frequency $f_l$ of the local oscillator shifts from the proper frequency $f_o$ by more than ± 1mHz, the transistor 65 is conductive. As previously stated the transistors 61-63 are operative only when the transistor 64 is conductive.

When the transistor 65 is conductive the differential amplifier composed of the transistors 66 and 67 is operative. A reference voltage is applied to the base terminal 20a of the transistor 66 and the average level voltage of the video detected output signal is applied to the base terminal 19a of the transistor to compare the voltage at the terminal 19a with the reference voltage at the terminal 20a. The transistors 66 and 67 are both nonconductive when the transistor 65 is nonconductive. As shown in FIG. 9F, the collector voltage $V_{66}$ of the transistor 66 has a low level when the local oscillating frequency $f_l$ is higher than the proper frequency $f_o$ by more than 1mHz. As shown in FIG. 9H, the collector voltage $V_{67}$ of the transistor 67 is in its low level when the frequency $f_l$ of the local oscillator shifts to a frequency that is lower by more than 1mHz than the desired frequency $f_o$.

The collector voltage $V_{61}$ of the transistor 61 is connected to the base of a transistor 73 and the collector voltage $V_{62}$ of the transistor 62 is connected to the base of a transistor 75. The collector voltage $V_{67}$ of the transistor 67 is connected to the base of a transistor 74 and the collector voltage $V_{66}$ of the transistor 66 is connected to the base of a transistor 76. The emitters of all four of the transistors 73-76 are grounded and their respective collector voltages $V_{73}$-$V_{76}$ have the waveforms shown in FIGS. 9B, 9D, 9G and 9I, respectively.

The collectors of the transistors 73 and 74 are connected by means of similarly polarized diodes to the base of a transistor 77, so that if at least one of the collector voltages $V_{73}$ or $V_{74}$ is at its high level as shown in FIGS. 9B and 9D, respectively, the transistor 77 will be conductive. The collectors of the transistors 75 and 76 are likewise connected by similarly polarized diodes to the base of another transistor 78, so that if at least one of the collector voltages $V_{75}$ or $V_{76}$ is at its high level as shown in FIGS. 9D and 9G, respectively, the transistor 78 will be conductive. The collector output voltage of the transistor 77 as obtained from an output terminal 79 is a signal $\overline{E}_U$, which is inverted from the normal AFT up-tuning voltage and is illustrated in FIG. 9J. In a similar manner the collector output voltage of the transistor 78 as obtained at an output terminal 80 is a voltage $\overline{E}_D$, which is inverted from the normal AFT down-tuning signal and is illustrated in FIG. 9K. Because these voltages are inverted in the frequency range in which the output voltage $E_U$ is "0", pulses will be supplied to the counter 35 in FIG. 5 to increase the count therein and thereby increase the local oscillator frequency $f_l$. Conversely, in the frequency range in which the output control signal $E_D$ is "0", the correct pulse is supplied to the counter 35 in FIG. 5 to cause that counter to count down to some extent. This causes a decrease in the frequency $f_l$ of the local oscillator. In the narrow frequency range $f_o \pm 50kHz$ both the voltages $E_U$ and $E_D$ have the value "1", corresponding to the fact that the tuning of the local oscillator in that narrow band represents the best tuning point. No frequency correcting pulses are supplied to the counter 35 when the tuner 1 is correctly tuned so closely to the desired video carrier frequency and has its local oscillator 4 very close to the desired frequency $f_o$.

FIG. 8 also shows a switching transistor 81, the collector-emitter path of which is connected between the base of the transistor 65 and ground. If the transistor 81 is conductive, the transistor 65 is forced to be nonconductive, which corresponds to the fact that the muting operation is in effect. The transistor 81 is conductive when the third detecting signal $P_4$ shown in FIG. 4E and obtained from the noise detector 27 in FIG. 3 has the value "2". The signal $P_4$ is applied to the base of a transistor 82 connected in a grounded-emitter circuit. The base of another grounded-emitter transistor 83 is directly connected to the collector of the transistor 82. Thus, when the signal $P_4$ has the value "1", the transistor 82 will be conductive and the transistor 83 will be nonconductive. In a similar manner, the first detecting signal $P_1$ shown in FIG. 4B is connected to the base of a grounded-emitter transistor 84, and the base of another grounded-emitter transistor 85 is directly connected to the collector of the transistor 84. The collectors of the transistors 83 and 85 are directly connected together and are connected by a resistor to the base of the transistor 81. When the signal $P_1$ has the value "1" the transistor 84 is conductive and therefore the transistor 85 is made nonconductive.

The operation of the AFT circuit in FIG. 9 will be described with reference to the waveforms in FIGS. 4G and 4H, respectively. It will be recalled that these waveforms are the result of tuning the local oscillator 4 of FIG. 1 over a frequency range from about 225mHz to about 250mHz. The up-tuning control signal $E_U$ shown in FIG. 4G begins approximately 3mHz below the desired frequency $f_o$ as determined by the frequency at which the third detecting signal $P_4$ drops to its "0" value. Below that frequency, the noise signal in the signal $P_4$ mutes the operation of the AFT circuit by way of the muting circuit 26 in FIG. 3. When the local oscillator frequency $f_l$ is close to the desired frequency $f_o$ which, for channel 4, is 230mHz, the signal $P_2$ takes over control and keeps the signal $E_U$ at the value "1" until the frequency $f_l$ is within less than $-50$ kHz of the desired frequency $f_o$.

If the frequency $f_o$ has for some reason become too high but not more than about 4mHz above the frequency $f_o$, the down-tuning signal $E_D$ shown in FIG. 4H is effective. Between the frequency $f_o + 50kHz$ and a somewhat higher frequency of about $f_o + 1mHz$, the signal $P_2$ is effective to cause the down-tuning control signal $E_D$ to operate. Between the frequency $f_o + 1mHz$ and the frequency $f_o + 4mHz$, the signal $P_1$ is effective to accomplish this purpose. Beyond the frequency $f_o + 4mHz$ the muting operation of the muting circuit 26 is effective due to the fact that sufficient noise signals are present to cause the signal $P_4$ to have the value "1" and the signal $P_1$ also has the value "1" in this frequency region.

The fine tuning control signals $E_U$ and $E_D$ are applied to the counter 35 by way of the NAND circuits 44 and 45, respectively. Both of these NAND circuits are controlled simultaneously by the output signal of the inverter 43 which has a "1" value at its output when both switches 37U and 37D are open. Then, the pulse signal $A_n$ is able to be passed through whichever of the NAND circuits 44 or 45 is enabled by the up-tuning AFT signal $E_U$ or the down-tuning AFT signal $E_D$. The pulses $A_n$ that pass through the respective NAND circuits 44 or 45 cause the count on the counter to change to a higher or lower value and thereby to change the code $B_1$-$B_n$ correspondingly. It will be recalled that the value of this code controls the frequency of the tuner 1.

What is claimed is:

1. An automatic fine tuning circuit for controlling the frequency to which the tuner of a television receiver is tuned, said receiver comprising a video IF amplifier, a video detector to detect the envelope of the video IF signal, and an audio circuit, said automatic fine tuning circuit comprising:

first means for forming a first detecting signal, said first means comprising a source of reference voltage and a comparator connected to said video detector to compare the average voltage level of the output signal of said video detector with said reference voltage and to provide said first detecting signal in dependence on such comparison;

second means for forming a second detecting signal comprising a frequency discriminator and means connecting said video IF amplifier to said frequency discriminator so that the output of the latter constitutes said second detecting signal; and third means for selectively controlling the tuning of said tuner in response to one of said first and second detecting signals, said third means including means responsive to the output of said video IF amplifier to select said second detecting signal for control of said tuner when the latter is tuned to a frequency within a predetermined frequency band that includes a television channel signal and to select said first detecting signal for control of the tuner when the latter is tuned to a frequency outside of said frequency band.

2. An automatic fine tuning circuit according to claim 1; and further comprising a noise detector to detect excessive noise signals in said audio circuit; and means for disabling the connection from said automatic fine tuning circuit to said tuner in response to the simultaneous detection of excessive noise signals by said noise detector and said first detecting signal corresponding to said average voltage level being higher than said reference voltage.

3. An automatic fine tuning circuit for controlling the frequency to which the tuner of a television receiver is tuned, said receiver comprising a video IF amplifier, a video detector to detect the envelope of the video IF signal, and an audio circuit, said automatic fine tuning circuit comprising:

first means for forming a first detecting signal, said first means including a smoothing circuit and a peak detector each connected to said video detector to receive envelope detected signals therefrom, said peak detector providing a reference voltage equal to the pedestal volttage level of a properly tuned television signal at the output of said video detector, and a comparator connected to said smoothing circuit and to said peak detector to compare output signal levels therefrom;

second means for forming a second detecting signal comprising a frequency discriminator and means connecting said video IF amplifier to said frequency discriminator; and third means for controlling the tuning of said tuner in response to said second detecting signal when the frequency to which the tuner is tuned is within a predetermined frequency band that includes a television channel signal, said third means comprising a signal connection to said comparator and to said tuner to control the frequency of said tuner beyond the limits of the frequency range in which said second detecting signal can control the frequency of said tuner.

4. The automatic fine tuning circuit of claim 1 comprising means to control the amplitude of signals in said video IF amplifier to have a substantially constant voltage.

5. An automatic fine tuning circuit for controlling the frequency to which the tuner of a television receiver is tuned, said receiver comprising a video IF amplifier, a video detector to detect the envelope of the video IF signal, and an audio circuit, said automatic fine tuning circuit comprising:

first means for forming a first detecting signal, said first means comprising a comparator connected to said video detector to compare the average voltage level of the output signal of said video detector with a reference voltage;

second means for forming a second detecting signal comprising a frequency discriminator and means connecting said video IF amplifier to said frequency discriminator;

means to control the amplitude of signals in said video IF amplifier to have a substantially constant voltage;

a switching circuit having a first input terminal connected to receive the output signal of said discriminator, a second input terminal connected to receive the output signal of said comparator, and an output terminal;

means for connecting said output terminal of the switching circuit to said tuner so that the tuning of the latter is selectively controlled by said first and second detecting signals in dependence on the condition of said switching circuit; and selecting signal means connected to the video IF amplifier to detect an envelope signal therefrom and to amplify an alternating signal portion of the resulting detected signal, said selecting signal means being connected to control said switching circuit to connect said first input terminal to said output terminal only when said tuner is tuned to a frequency relatively close to the desired frequency.

* * * * *